(12) United States Patent
Baars et al.

(10) Patent No.: US 8,853,810 B2
(45) Date of Patent: Oct. 7, 2014

(54) INTEGRATED CIRCUITS THAT INCLUDE DEEP TRENCH CAPACITORS AND METHODS FOR THEIR FABRICATION

(75) Inventors: Peter Baars, Dresden (DE); Till Schloesser, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 50 days.

(21) Appl. No.: 13/218,262

(22) Filed: Aug. 25, 2011

(65) Prior Publication Data

US 2013/0049089 A1 Feb. 28, 2013

(51) Int. Cl.

| H01L 27/108 | (2006.01) |
|---|---|
| H01L 21/8242 | (2006.01) |
| H01L 27/12 | (2006.01) |
| H01L 21/84 | (2006.01) |
| H01L 27/02 | (2006.01) |
| H01L 49/02 | (2006.01) |

(52) U.S. Cl.
CPC ............ *H01L 21/84* (2013.01); *H01L 27/1203* (2013.01); *H01L 27/0207* (2013.01); *H01L 27/1087* (2013.01); *H01L 28/91* (2013.01)
USPC .......................................... 257/438; 438/243

(58) Field of Classification Search
USPC ......... 438/243, 386, 190, 171, 239, 244, 250, 438/393, 353, 387, 396; 257/E27.091, 257/E27.092, E27.095, E29.2, E29.201, 257/E29.26, E29.346, E21.396, E21.651
See application file for complete search history.

(56) References Cited

U.S. PATENT DOCUMENTS

| 2001/0019893 A1* | 9/2001 | Prall et al. ...................... 438/689 |
| 2002/0195637 A1* | 12/2002 | Kokubun ....................... 257/301 |
| 2004/0046199 A1* | 3/2004 | Wu ................................ 257/301 |
| 2005/0026382 A1* | 2/2005 | Akatsu et al. ................. 438/386 |
| 2007/0057302 A1* | 3/2007 | Ho et al. ........................ 257/301 |
| 2009/0159948 A1* | 6/2009 | Ho et al. ........................ 257/301 |
| 2010/0032742 A1* | 2/2010 | Barth et al. ................... 257/301 |
| 2010/0041221 A1* | 2/2010 | Arnold et al. ................. 438/585 |
| 2010/0090263 A1* | 4/2010 | Kunkel et al. ................. 257/296 |
| 2011/0133310 A1* | 6/2011 | Anderson et al. ............. 257/532 |

\* cited by examiner

*Primary Examiner* — Julio J Maldonado
*Assistant Examiner* — Moin Rahman
(74) *Attorney, Agent, or Firm* — Ingrassia Fisher & Lorenz, P.C.

(57) ABSTRACT

Methods are provided for fabricating an integrated circuit that includes a deep trench capacitor. One method includes fabricating a plurality of transistors on a semiconductor substrate, the plurality of transistors each including gate structures, source and drain regions, and silicide contacts to the source and drain regions. A trench is then etched into the semiconductor substrate in proximity to the drain region of a selected transistor. The trench is filled with a layer of metal in contact with the semiconductor substrate, a layer of dielectric material overlying the layer of metal, and a second metal overlying the layer of dielectric material. A metal contact is then formed coupling the second metal to the silicide contact on the drain region of the selected transistor. A bit line is formed contacting the source region of the selected transistor and a word line is formed contacting the gate structure of the transistor.

9 Claims, 9 Drawing Sheets

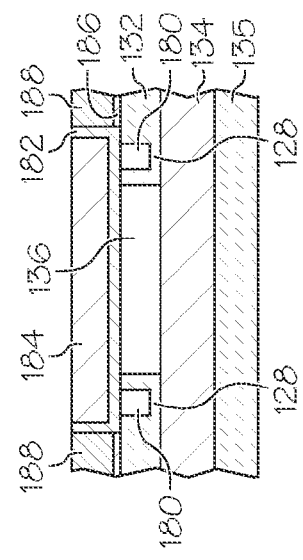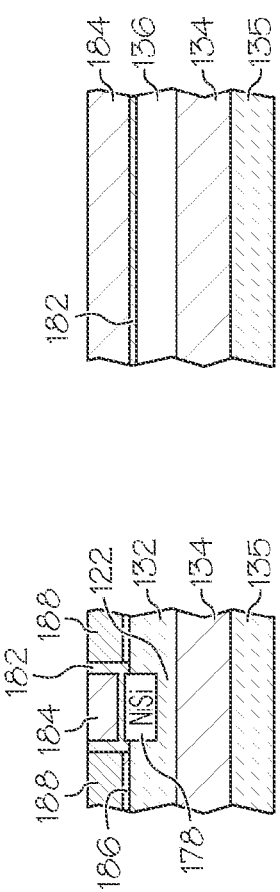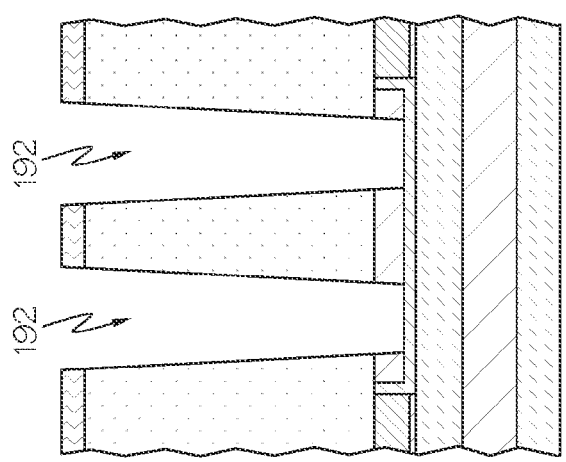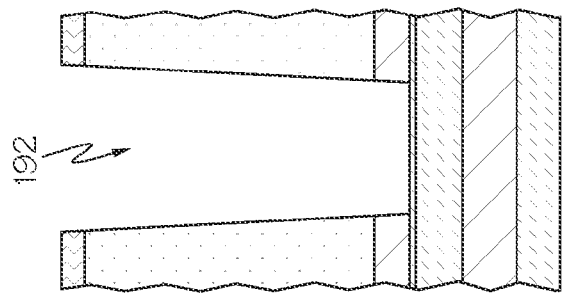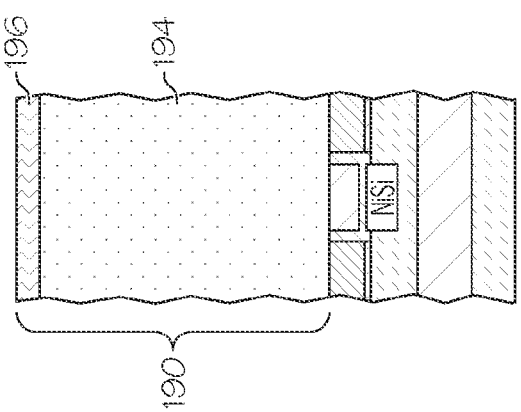

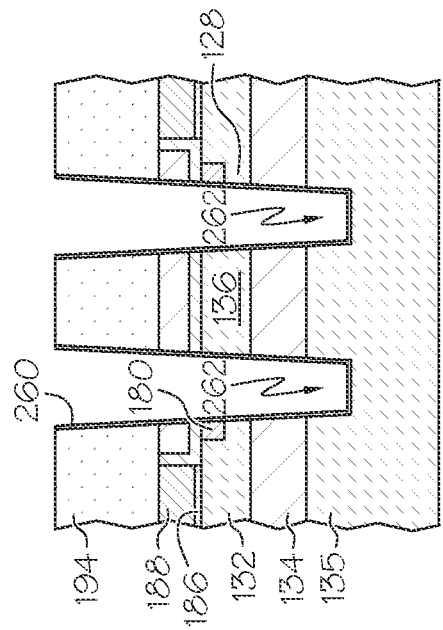
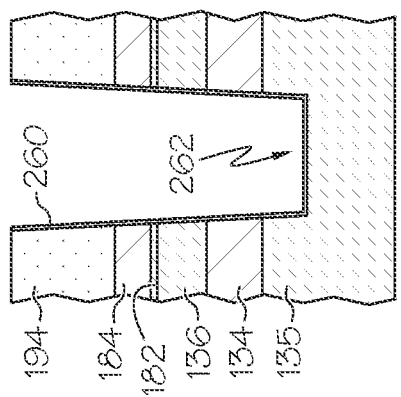
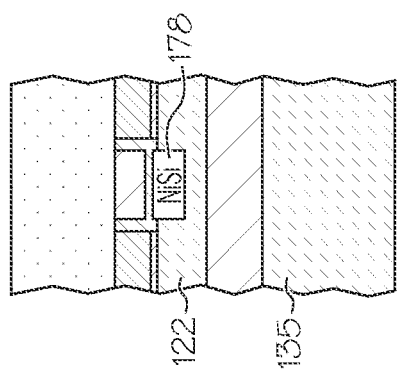

INTEGRATED CIRCUITS THAT INCLUDE DEEP TRENCH CAPACITORS AND METHODS FOR THEIR FABRICATION

TECHNICAL FIELD

The present invention generally relates to integrated circuits and to methods for fabricating integrated circuits, and more particularly relates to integrated circuits that include deep trench capacitors and to methods for fabricating integrated circuits that include deep trench capacitors.

BACKGROUND

Efficient microprocessors (MPUs) have come to rely on embedded dynamic random access memory (eDRAM) for some cache applications that require extremely dense memory. That is, the MPU often includes memory (i.e., eDRAM) on the same semiconductor chip for such applications as the L3 cache memory. The most compact DRAM cell is the one transistor, one capacitor cell. To insure that the memory is robust as well as compact requires a high value capacitor that can be implemented in a small space on the chip. For this reason eDRAM has come to use deep trench capacitors to complete the memory cell. A deep trench capacitor is a vertical element; high capacitance is achieved by increasing the size of the capacitor by extending into the semiconductor substrate rather than by spreading out on the surface of the substrate.

Deep trench capacitors that are formed early in the process of circuit fabrication suffer from the high thermal budget that is required during front end of the line (FEOL) processing. The high thermal budget comes from, for example, temperatures required for depositions and anneals. The high thermal budget leads to a degradation of quality of the capacitor dielectric, especially when the capacitor dielectric is a high dielectric constant (high-k) material. The degradation of the capacitor dielectric makes thicker dielectrics necessary in order to suppress leakage currents. The thicker dielectric, however, results in a lower capacitance per unit area which can only be compensated for by increasing the depth of the trench capacitor. Increasing the depth of the trench capacitor increases the aspect ratio (the ratio of depth to width) of the trench which, in turn, leads to processing difficulties such as difficult etching requirements. High aspect ratio etches can lead to severe defect and yield problems. Additionally, in conventional processing the connection between the inner electrode of the trench capacitor and the drain region of the associated memory cell transistor is made by a polycrystalline silicon strap. If the polycrystalline strap is implemented with the first level of polycrystalline silicon, the strap is less conductive than metal, and if the strap is implemented with the second level of polycrystalline silicon the effective resistance of the strap is compromised by a Schottky barrier that is created at a silicon-metal interface.

Accordingly, it is desirable to provide integrated circuits that include capacitance deep capacitors and to provide highly manufacturable methods for fabricating integrated circuits that include high capacitance deep trench capacitors. In addition, it is desirable to provide methods for fabricating integrated circuits that include a deep trench capacitor having a metal strap between a capacitor electrode and an associated transistor. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating integrated circuits that includes a deep trench metal-insulator-metal capacitor. One method includes completing the front end of line processing of a plurality of transistors on a semiconductor substrate, the plurality of transistors each including gate structures, source and drain regions, and silicide contacts to the source and drain regions. A trench is then etched into the semiconductor substrate in proximity to the drain region of a selected transistor. The trench is filled with a layer of metal in contact with the semiconductor substrate, a layer of dielectric material overlying the layer of metal, and a second metal overlying the layer of dielectric material. A metal contact is then formed coupling the second metal to the silicide contact on the drain region of the selected transistor. A bit line is formed contacting the source region of the selected transistor and a word line is formed contacting the gate structure of the transistor.

In accordance with another embodiment, the method for fabricating integrated circuits that include deep trench capacitors includes completing front end processing of a plurality of transistors formed in and on a semiconductor substrate. A plurality of deep trench metal-insulator-metal capacitors is formed after completing the front end processing. A plurality of metal contacts is formed, each of the plurality of metal contacts coupling one of the plurality of capacitors to a drain region of one of the plurality of transistors.

In accordance with one embodiment an integrated circuit including an embedded dynamic random access memory (eDRAM) formed in and on a semiconductor substrate is provided. The IC includes a transistor having a gate electrode coupled to a word line, a source coupled to a bit line and a drain region having a metal silicide contact to the drain region. The IC further includes a deep trench capacitor having a first electrode electrically coupled to the substrate, a high dielectric constant capacitor dielectric overlying the first electrode, and a metal top electrode, the deep trench capacitor etched through the metal silicide contact. A metal bridge electrically couples the metal silicide contact to the metal top electrode.

BRIEF DESCRIPTION OF THE DRAWINGS

The present invention will hereinafter be described in conjunction with the following drawing figures, wherein like numerals denote like elements, and wherein:

FIGS. 4-14 illustrate, in cross sectional views, method steps, in accordance with various embodiments, for fabricating an integrated circuit including a deep trench capacitor memory array.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
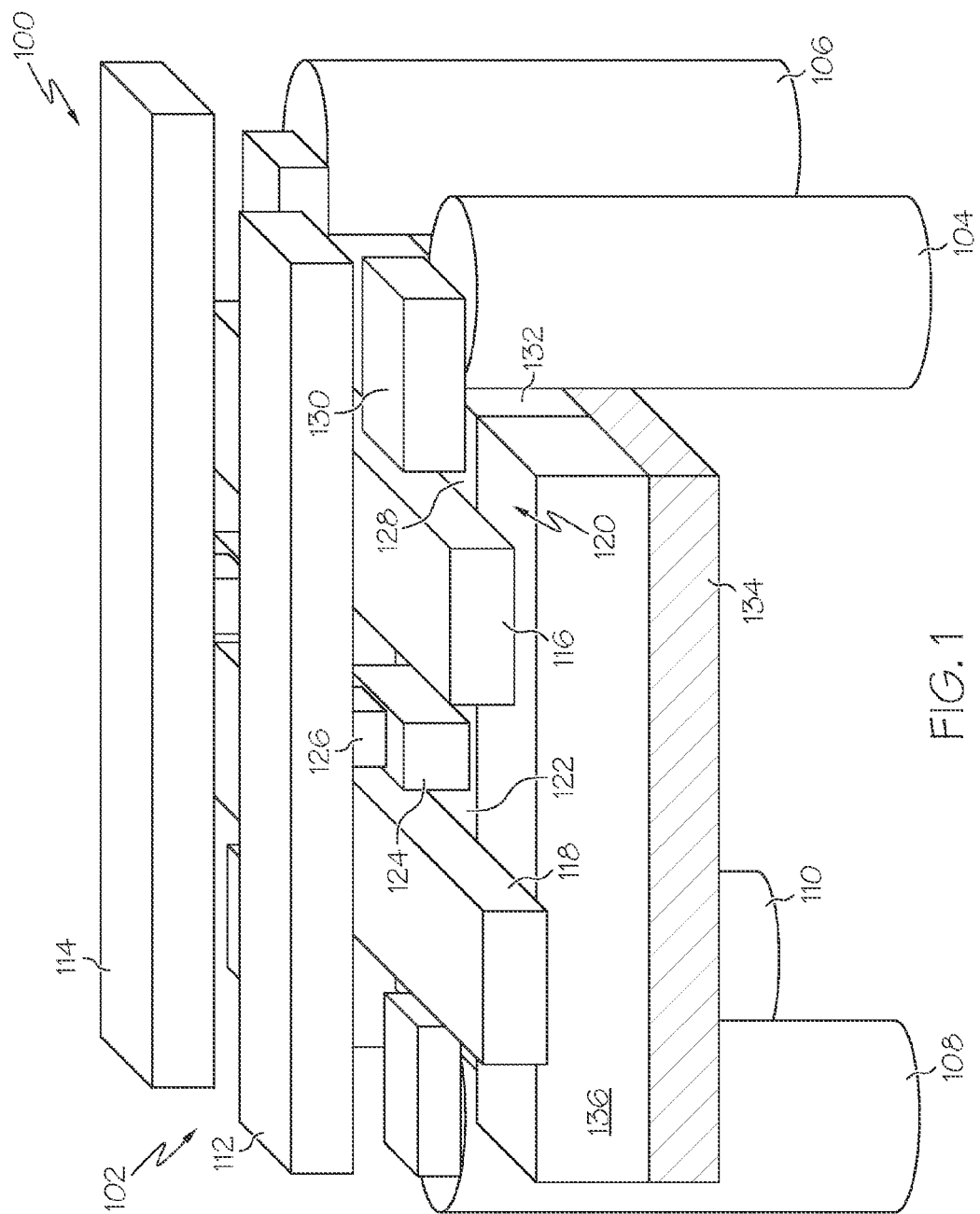
FIG. 1 illustrates schematically, in a partially transparent perspective view, a portion of an integrated circuit in accordance with one embodiment.

FIG. 1 illustrates schematically, in a partially transparent perspective view, a portion of an integrated circuit (IC) 100 in accordance with one embodiment. The illustrated portion of IC 100 depicts a dynamic random access memory (DRAM) cell layout 102 that is particularly useful for embedded DRAMs (eDRAMs). Although only a 4-bit memory array is shown, the array can be expanded to any number of bits as are required by the IC being implemented. An eDRAM is a memory that is embedded as part of a larger circuit function such as a microprocessor or other logic function.

Memory cell layout 102 includes four deep trench capacitors 104, 106, 108, and 110, two bit lines 112 and 114, and two word lines 116 and 118. One of the bits of the memory array includes transistor 120 coupled to deep trench capacitor 104. Transistor 120 is a MOSFET (metal oxide semiconductor field effect transistor) having a source region 122 coupled to bit line 112 through contacts 124 and 126, a gate structure coupled to and a part of word line 116, and a drain region 128 coupled to deep trench capacitor 104 through contact 130. Methods for fabricating IC 100 will be explained below. Suffice it to say at this point that IC 100 is formed in and on a semiconductor substrate. In accordance with the illustrated embodiment the semiconductor substrate is a semiconductor on insulator (SOI) substrate, but the IC can also be fabricated on a bulk semiconductor substrate. The SOI substrate includes a thin layer of semiconductor material 132, only a portion of which is visible in this view, overlying an insulating layer 134. Although not illustrated in FIG. 1 so as not to unnecessarily confuse the drawing, insulating layer 134 is supported by a high conductivity semiconductor substrate 135. One electrode of deep trench capacitor 104 is electrically coupled to the high conductivity semiconductor substrate and the other electrode is electrically coupled to drain region 128. Isolation between devices, as required by the design of the circuit being implemented is provided by shallow trench isolation (STI) 136.

Figure 2:
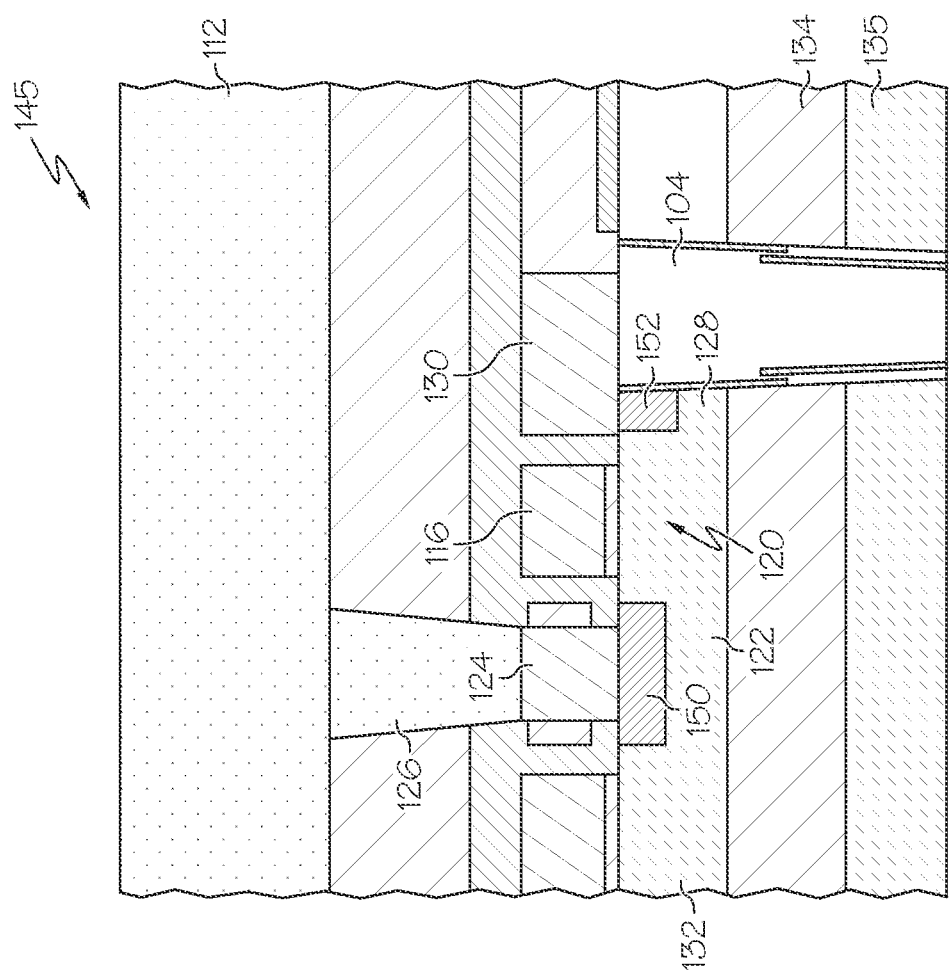
FIG. 2 illustrates, in a cross sectional view, a single memory bit.

FIG. 2 illustrates, in a cross sectional view, for example through transistor 120 and deep trench capacitor 104, a single memory bit 145. In a WRITE operation, to store data in this memory bit, charge (either a "1" or "0") is placed on bit line 112 and word line 116 is activated to turn transistor 120 "ON". The charge on bit line 112 is conveyed through contacts 126 and 124 to bit line contact 150 which is a metal silicide contact to source region 122. Because transistor 120 is turned "ON", charge passes through the channel region beneath word line (gate electrode) 116 to drain region 128. Drain region 128 is coupled through metal silicide contact 152 formed on drain region 128 and metal contact 130 to the inner electrode of deep trench capacitor 104 where the charge is stored. The outer electrode of capacitor 104 is coupled to high conductivity semiconductor substrate 135. The data on bit line 112 is thus stored on capacitor 104. In a READ operation word line 116 is again activated to turn transistor 120 "ON" and any charge (data) stored on capacitor 104 passes through transistor 120 to bit line 112 where the state of the charge (either a "1" or "0") is determined.

Figure 3:
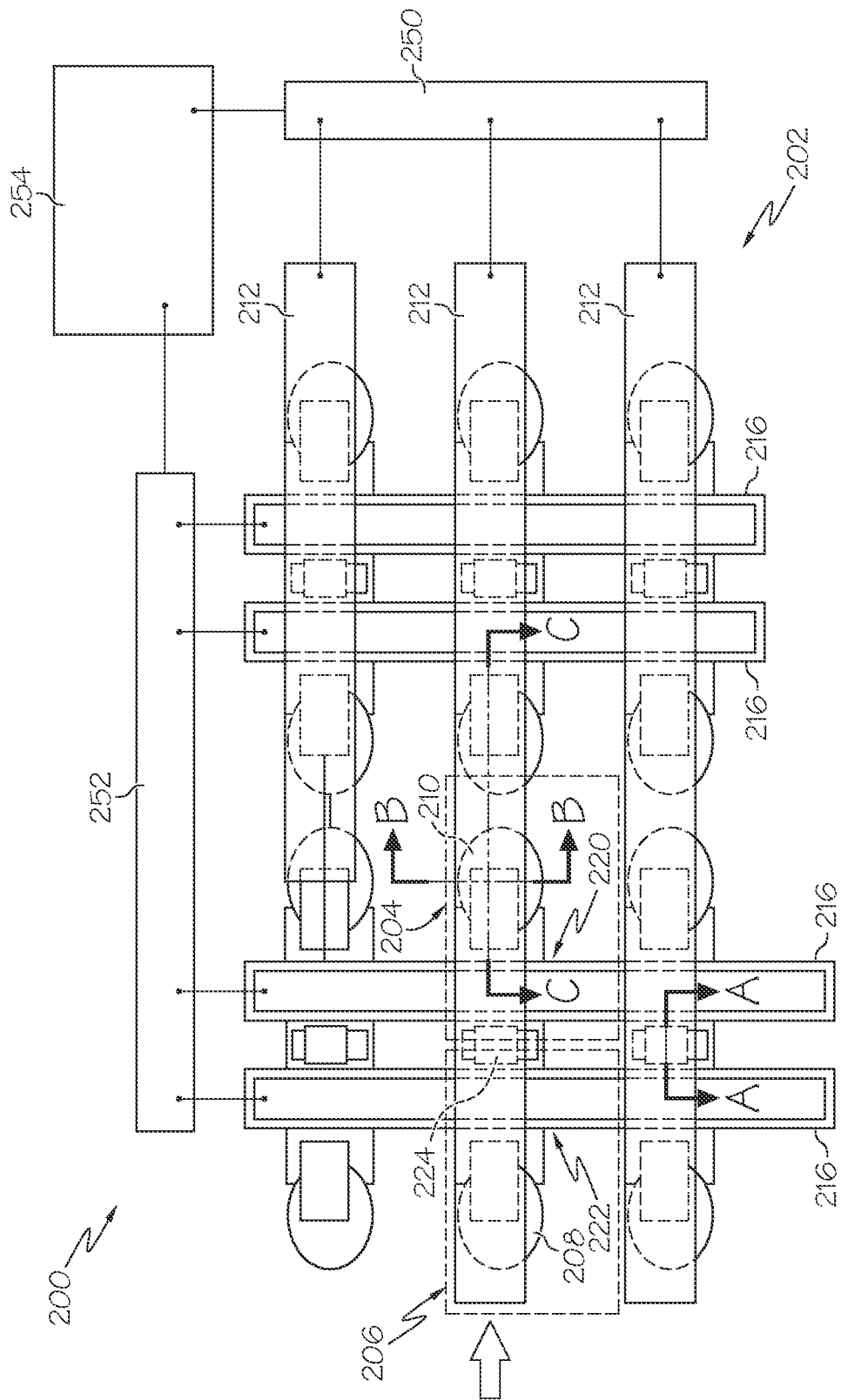
FIG. 3 illustrates schematically, in a transparent top view, an integrated circuit including an eDRAM memory cell array in accordance with an embodiment.

FIG. 3 illustrates schematically, in a transparent top view, an integrated circuit 200 including an eDRAM memory cell array 202 similar to memory cell layout 102 illustrated in FIG. 1. As illustrated, memory cell array 202 includes only twelve memory cells, although an IC can include any number of cells as required by the circuit being implemented. Two memory cells 204 and 206 are indicated by dashed lines. Memory cell 204 includes a transistor 220 and a deep trench capacitor 210. Memory cell 206 includes a transistor 222 and a deep trench capacitor 208. The two memory cells share a bit line contact 224. Other memory cells are similar to memory cells 204 and 206 although the individual transistors and deep trench capacitors are not individually identified by number. Bit lines 212 overly the memory transistors and deep trench capacitors and are coupled to respective rows of the transistors through bit line contacts similar to bit line contact 224. Word lines 216 are coupled to the gates of respective columns of the memory transistors. IC 200 also includes a bit line driver 250, a word line driver 252, and a logic circuit such as a microprocessor 254. Bit lines 212 are coupled to a bit line driver 250 and word lines 216 are coupled to a word line driver 252. The bit line driver and word line driver are coupled to a logic circuit 254. Data stored in the memory cell array can be used by logic circuit 254.

FIGS. 4-14 schematically illustrate, in cross sectional views taken as indicated through portions of the array in FIG. 3, method steps for fabricating an integrated circuit 200 including deep trench capacitors in accordance with various embodiments. In the FIGURES cross section A-A is taken perpendicular to a word line, cross section B-B is taken parallel to a word line in the shallow trench isolation, and cross section C-C is taken perpendicular to a word line through a deep trench capacitor. Although the term "MOS transistor" or MOSFET properly refers to a device having a metal gate electrode and an oxide gate insulator, those terms will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the manufacture of ICs are well known and so, in the interest of brevity, many conventional steps will only be mentioned briefly herein or will be omitted entirely without providing the well known process details.

The fabrication of IC 200 begins with conventional front end of line (FEOL) processing to form transistors of both the memory array and the associated logic circuit. The methods described herein are compatible with either gate first technology or replacement gate technology. As mentioned above, the embodiments can be implemented on either a bulk semiconductor wafer or on an SOI substrate. For purposes of illustration only, but without limitation, the various embodiments for fabricating IC 200 will be illustrated with a replacement gate technology on an SOI substrate. Methods in accordance with one embodiment begin as illustrated in FIG. 4 with cross sections through three regions of memory array 202. IC 200 is fabricated in and on a SOI substrate that includes a thin semiconductor layer 128, an insulating layer 134 and a high conductivity semiconductor substrate 135. The thin semiconductor layer and the high conductivity semiconductor substrate can be any of the semiconductor materials used in the fabrication of semiconductor ICs such as silicon, silicon admixed with germanium or carbon, or the like. Insulating layer 134 can be, for example, silicon oxide. In the conventional front end of line processing isolation between devices is provided by shallow trench isolation (STI) 136, impurity doped well regions are formed by ion implantation, source regions 122 and drain regions 128 are also formed by ion implantation, and contacts 178 and 180 to the source and drain regions, respectively, are formed by a metal silicide such as nickel silicide. Processing of the plurality of transistors that make up the logic circuit portion of IC 200 proceed in conventional manner and need not be discussed.

In the replacement gate technology an insulating layer 182 such as a layer of silicon nitride is deposited over a dummy gate as well as over the metal silicide contacts. An inter layer dielectric (ILD) 184 such as a layer of silicon oxide is deposited to fill the spaces between the dummy gates. The insulating layer 182 and ILD 184 are polished back, for example by chemical mechanical planarization (CMP), to expose the dummy gate and the dummy gate is removed. A thin gate insulator 186 is grown or deposited and a replacement gate electrode material is deposited. Preferably the thin gate insulator is a high dielectric constant (high k) material such as an oxide or zirconium or hafnium, but may also be grown silicon dioxide either alone or layered with a high k material. By "high k" is meant a dielectric constant greater than the dielectric constant of silicon dioxide. High k materials are usually selected that have dielectric constants much higher than that of silicon dioxide. Preferably the replacement gate material is a high conductivity material such as a metal, and may include a layered structure of a threshold voltage-determining material and a metal or impurity doped polycrystalline silicon. The replacement gate material is polished back, for example by CMP to form gate electrodes 188. The topology of the semiconductor structure is flat after the polishing back of the replacement gate material. The replacement gates form the word lines of the memory array. Word lines extend into and out of the drawing figures and are a continuation of the gate electrodes as is better illustrated in FIG. 1.

The method for fabricating IC 200, in accordance with one embodiment, continues as illustrated in FIG. 5. A layer of hard mask material 190 is deposited over the flat surface of the semiconductor structure and is photolithographically patterned and etched to form openings 192 overlying locations where deep trench capacitors will be formed. Preferably the layer of hard mask material includes a thick layer (about 1 micrometer (μm)) 194 of silicon oxide overlaid by a carbon/silicon oxynitride layer 196. Layer 196 can be, for example, a layer of amorphous carbon having a thickness of 300-700 nanometers (nm) overlaid by a layer of silicon oxynitride having a thickness of 50-100 nm. Much of layer 196 will be consumed during the etching of layer 194.

Figure 6C:
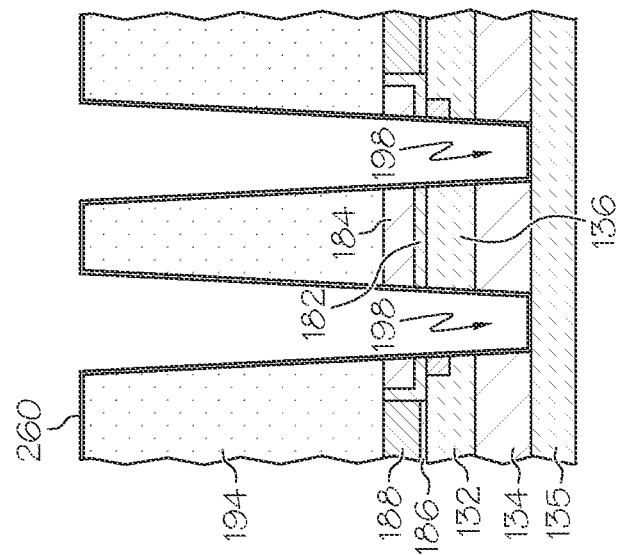
Figure 6B:
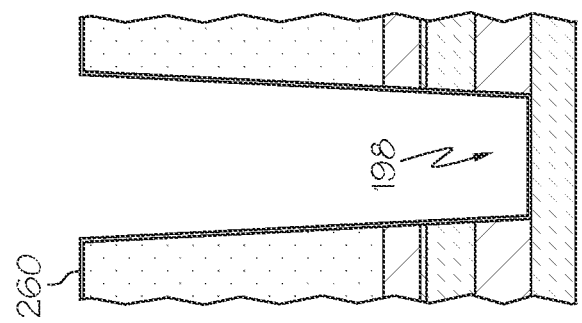
Figure 6A:
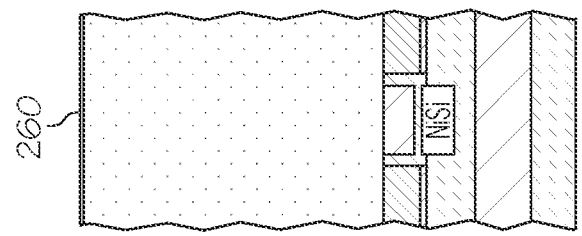

As illustrated in FIG. 6, the hard mask is used as an etch mask and trenches 198 are etched through insulating layers 184 and 182, STI 136, portions of thin semiconductor layer 132 in close proximity to drain regions 128, and through insulating layer 134. Hard mask layer 196 as well as part of hard mask layer 194 will be consumed by this etch step. In accordance with one embodiment a thin oxide liner 260 is deposited to line trench 198 and to protect the exposed sidewall of thin semiconductor layer 132 from a subsequent semiconductor etch.

After etching through the layers overlying high conductivity semiconductor substrate 135 and forming thin oxide trench liner 260, a highly selective semiconductor etchant is employed in an anisotropic etch process to etch deep trenches 262 into the high conductivity semiconductor substrate as illustrated in FIG. 7. The trenches are preferably etched to a depth of 3-4 μm by an etchant that etches the semiconductor material at a rate up to twenty times the etch rate of hard mask layer 194. Even with such highly selective etchants, much of hard mask layer 194 will be eroded by the trench etching. Because the etchant process is anisotropic, thin oxide trench liner 260 protects the exposed sidewall of thin semiconductor layer 132.

Figure 8:
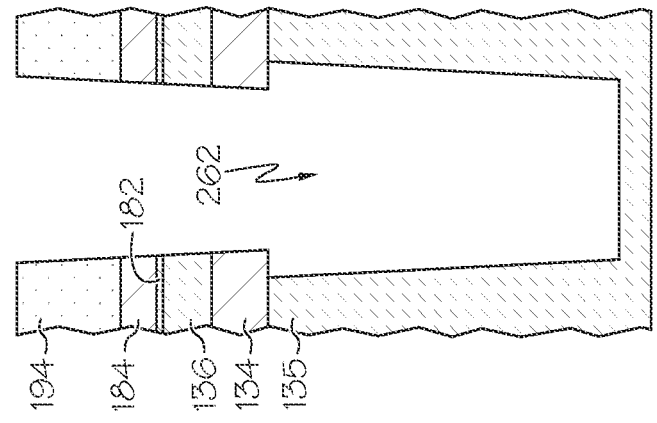

In accordance with one embodiment, as illustrated in FIG. 8, a wet etch is applied to widen trenches 262. If high conductivity semiconductor substrate 135 is silicon, an etchant such as a tetramethylammonium hydroxide based etchant can be used. The widening of trenches 262 with such an etchant is crystal orientation dependent, so the resulting trench may be asymmetrically shaped. The widening results in the trench being wider than the opening through the overlying oxide layer 134.

Figure 9:
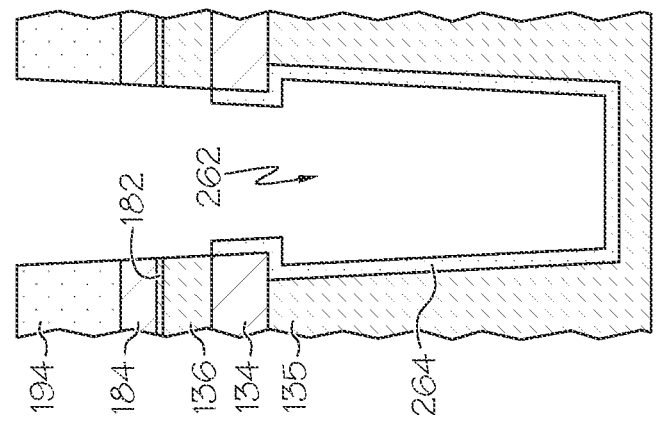

The method for fabricating IC 200 continues, in accordance with one embodiment by the deposition of a conductive material 264 to line the walls of deep trenches 262. Conductive material 264 can be, for example, a layer of titanium nitride having a thickness of about 15 nm. Titanium nitride is a ceramic material often called a "barrier metal" because of its diffusion barrier properties and high electrical conductivity. The conductive material, hereinafter referred to as titanium nitride, is preferably deposited by a process of atomic layer deposition (ALD) to insure complete coverage of the side walls of the deep trenches, including under the protruding lip of insulating layer 134. The ALD process deposits titanium nitride on all exposed surfaces, and it is necessary to remove the titanium nitride that is not in the deep trenches. After depositing titanium nitride 264 the deep trenches are filled with a sacrificial etch resistant material (not illustrated) such as photoresist, spin on glass, or one of the commercially available organic planarizing layers. These materials can be applied in a liquid or semi-liquid state to easily fill the deep trenches. The top portion of the sacrificial material is removed so that etch resistant material fills the deep trenches only up to a level substantially equal to the top of insulating layer 134. The remaining sacrificial etch resistant material is then used as an etch mask and titanium nitride 264 above the etch resistant material is removed by etching in either a wet or dry etchant. After removing the remaining sacrificial etch resistant material, the titanium nitride 264 remains on the walls of the deep trenches as illustrated in FIG. 9. The remaining titanium nitride is in electrical contact with high conductivity semiconductor substrate 135. Titanium nitride 264, in combination with high conductivity semiconductor substrate 135, forms the outer or bottom electrodes of the deep trench capacitors.

Figure 10:
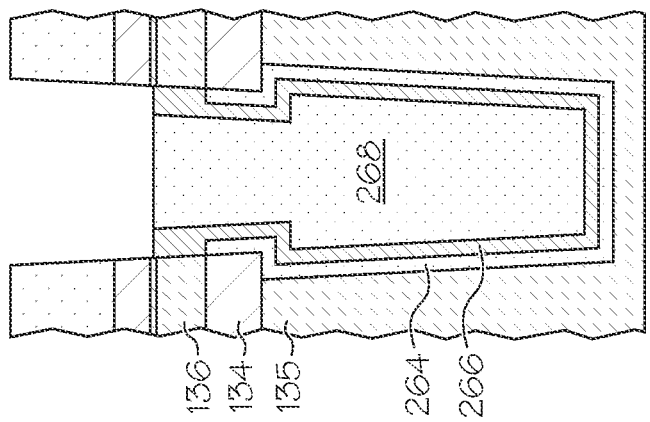

The method for fabricating IC 200 continues, in accordance with one embodiment, by depositing a capacitor dielectric 266 and an inner or top capacitor electrode 268 as illustrated in FIG. 10. The capacitor dielectric can be, for example, a layer of high k dielectric material such as an oxide of zirconium or hafnium having a thickness of about 10 nm. The capacitor dielectric can be deposited on titanium nitride layer 264 by atomic layer deposition. Top capacitor electrode 268 can be tungsten or other metal. Preferably a layer of titanium nitride or other conductive barrier material (not illustrated) is deposited on the capacitor dielectric before the tungsten or other metal to avoid diffusion of the metal into the dielectric. Excess top capacitor electrode material is removed to recess the top electrode to substantially the same height as the top surface of STI 136.

Figure 11A:
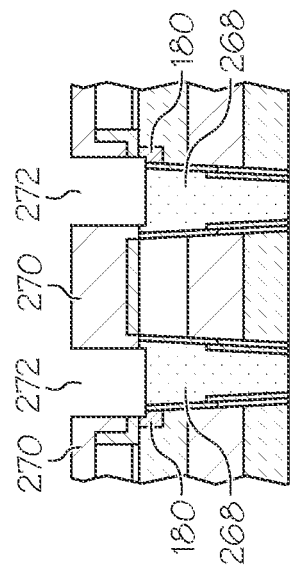
Figure 11B:
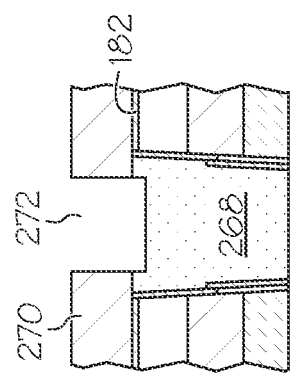
Figure 11C:
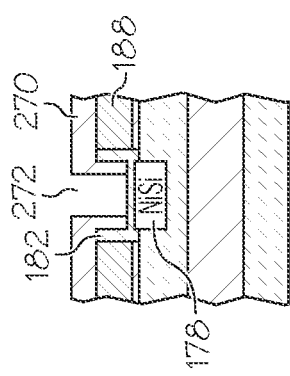

As illustrated in FIG. 11, the method continues in accordance with one embodiment by depositing a layer 270 of silicon oxide to fill any recesses in the surface of the structure. Layer 270 is planarized, for example by CMP. The planarization is continued until the thickness of layer 270 over gate electrodes 188 is only a few 10s of nanometers. Openings 272 are etched through the planarized layer of silicon oxide and through silicon nitride layer 182 to expose contact areas on top capacitor electrodes 268 and on metal silicide bit line contacts 178. The openings overlying top capacitor electrodes 268 are wide enough to also expose a portion of metal silicide drain region contacts 180. The openings are patterned and etched using standard photolithography and etch techniques.

Figure 12A:
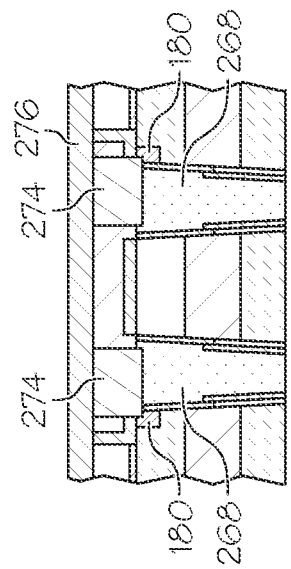
Figure 12B:
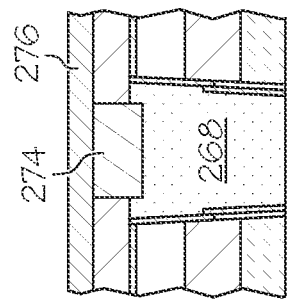
Figure 12C:
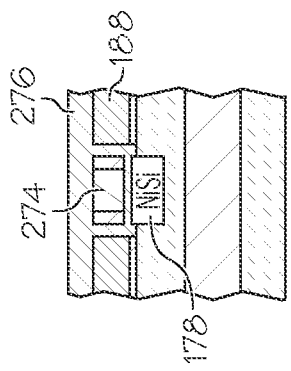

As illustrated in FIG. 12, metal plugs 274 are formed in openings 272 to contact metal silicide bit line contacts 178, top capacitor electrodes 268 and metal silicide drain region contacts 180. The metal plugs electrically couple the top or inner electrode of the deep trench capacitors directly to the drain regions of the memory transistors without any intervening polycrystalline silicon as in more conventional approaches to forming deep trench capacitors. Metal plugs 274 can be formed, for example, by standard tungsten metal plug technology. Excess tungsten is removed and the surface is planarized, for example, by CMP that stops at the height of the top of the gate electrodes. In accordance with one embodiment a silicon nitride diffusion barrier 276 is deposited over the planarized surface. The silicon nitride diffusion barrier can be deposited, for example, by plasma enhanced chemical vapor deposition to a thickness of about 10-50 nm.

Figure 13A:
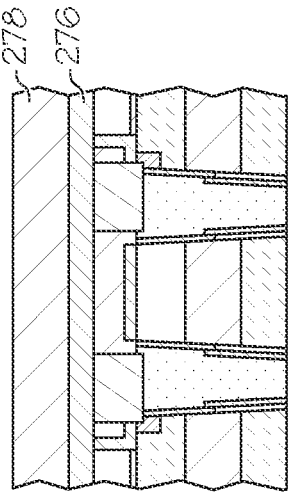
Figure 13B:
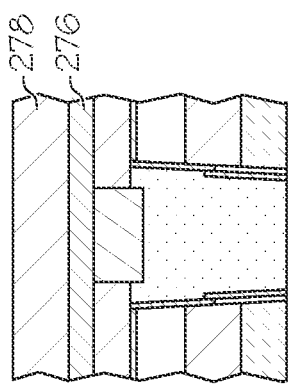
Figure 13C:
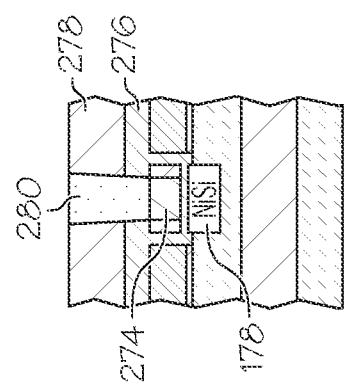
Figure 14A:
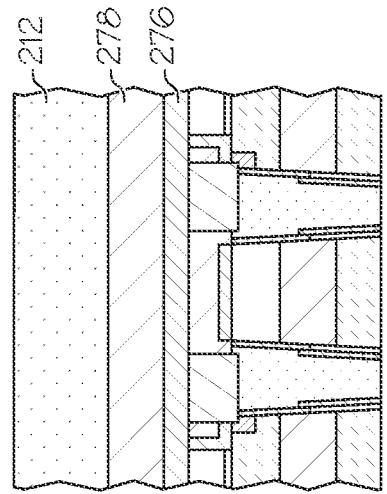
Figure 14B:
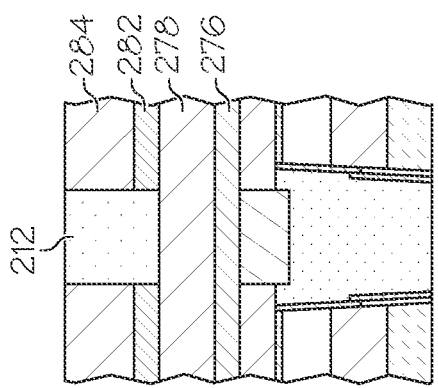
Figure 14C:
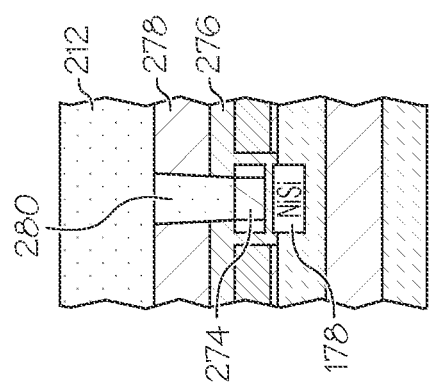

FIGS. 13 and 14 illustrate process steps in accordance with one embodiment for forming bit lines 212 and the contacts to shared bit line contacts such as shared bit line contact 224. As illustrated in FIG. 13 a layer of ILD 278 is deposited over silicon nitride diffusion barrier 276. The layer of ILD can be, for example a deposited layer of silicon oxide. An opening is etched through the ILD and the silicon nitride diffusion barrier to expose metal plug 274 coupled to metal silicide bit line contact 178. The opening can be formed by standard photolithography and etch techniques. The opening is filled with a plug 280 of copper or other conductive material. A copper plug can be formed, for example, by a damascene process in which copper is deposited into the opening and the excess copper overlying ILD layer 278 (the copper overburden) is removed by CMP.

Bit lines 212 are formed, in accordance with one embodiment, by depositing another silicon nitride diffusion barrier layer 282 overlying ILD layer 278 and plug 280. A layer of ILD 284 is deposited overlying the diffusion barrier layer as illustrated in FIG. 14. Openings are etched in the ILD and diffusion barrier layers using standard photolithography and etch techniques. The openings mimic the desired pattern of bit lines 212. Copper is deposited, for example by a plating process, overlying the ILD layer and filling the openings. The excess copper is removed by CMP to leave bit lines 212 contacting bit line contacts 224 through plugs 274 and 280 and metal silicide bit line contact 178.

Following the formation of bit lines 212, the method for fabricating IC 200 proceeds through the normal back end of line processing steps. These include additional ILD layers, additional metal layers that interconnect the memory array to the logic portion of the IC, passivation layers and the like. Notably the deep trench capacitors are formed after most of the thermal budget has been expended so that the capacitor dielectric remains as a high quality insulator. Additionally, the embodiments described above result in a low resistance contact between the top or inner capacitor electrode and the drain region of the memory transistor.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
   fabricating a plurality of transistors on a semiconductor substrate, the plurality of transistors each including gate structures, source and drain regions, and silicide contacts to the source and drain regions;
   after fabricating the plurality of transistors including after forming the silicide contacts, depositing a layer of hard mask material overlying the transistors;
   patterning the layer of hard mask material to form an opening through the layer of hard mask material in proximity to the drain region of a selected one of the transistors;
   etching a trench into the semiconductor substrate through the metal silicide contacts to the drain regions using the patterned layer of hard mask material as an etch mask;
   filling the trench with a layer of metal in contact with the semiconductor substrate, a layer of dielectric material overlying the layer of metal, and a second metal overlying the layer of dielectric material;
   after filling the trench with the layer of metal, the layer of dielectric material, and the second metal, forming a metal contact coupling the second metal to the silicide contact on the drain region of the selected one of the transistors; and
   forming a bit line contacting the source region of the selected one of the transistors and a word line contacting the gate structure of the selected one of the transistors.

2. The method of claim 1 wherein fabricating a plurality of transistors comprises fabricating a first plurality of transistors forming a logic circuit and a second plurality of transistors forming a memory circuit, and wherein the second plurality of transistors includes the selected one of the transistors.

3. The method of claim 1 wherein the semiconductor substrate comprises a semiconductor on insulator substrate having a semiconductor layer overlying an insulating layer overlying a high conductivity semiconductor substrate and wherein the step of etching comprises etching through the semiconductor layer and the insulating layer and into the high conductivity semiconductor substrate.

4. The method of claim 3 wherein filling the trench comprises:
   depositing a layer of titanium nitride;
   depositing a layer of high dielectric constant material overlying the titanium nitride;
   depositing a second layer of titanium nitride overlying the layer of high dielectric constant material, and
   depositing tungsten overlying the second layer of titanium nitride.

5. The method of claim 4 further comprising:
   after depositing the layer of titanium nitride, filling the trench with a sacrificial material;
   etching the sacrificial material back to a height substantially equal to the level of the insulating layer;
   etching the layer of titanium nitride using the sacrificial material as an etch mask; and
   removing the sacrificial material.

6. The method of claim 3 wherein etching a trench further comprises etching with a semiconductor etchant to increase the trench width in the high conductivity semiconductor substrate.

7. The method of claim 1 further comprising, after filling the trench:
   depositing a layer of oxide;
   etching contact openings through the layer of oxide, one of the contact openings exposing a portion of the second metal and a portion of the silicide contact on the drain region of the selected one of the transistors and a second one of the openings exposing a portion of the silicide contact on the source region of the selected one of the transistors;

filling the contact openings with conductive metal plugs, the metal plug in the one contact opening coupling the second metal to the silicide contact on the drain region and the conductive metal plug in the second opening contacting the silicide contact overlying the source region; and depositing a layer of diffusion barrier material overlying the conductive metal plug.

8. The method of claim 7 further comprising:

depositing a layer of oxide overlying the layer of diffusion barrier material;

etching a contact opening through the layer of oxide and the layer of diffusion barrier material overlying the source region of the selected one of the transistors, the contact opening exposing the conductive metal plug overlying the silicide contact overlying the source region;

filling the contact opening with a conductive material; and forming the bit line contacting the conductive material.

9. A method for fabricating an integrated circuit comprising:

fabricating a plurality of transistors on a semiconductor substrate, the plurality of transistors each including gate structures, source and drain regions, and silicide contacts to the source and drain regions;

after fabricating the plurality of transistors including after forming the silicide contacts, depositing a layer of hard mask material overlying the transistors;

patterning the layer of hard mask material to form an opening through the layer of hard mask material in proximity to the drain region of a selected one of the transistors;

etching a trench into the semiconductor substrate using the patterned layer of hard mask material as an etch mask;

filling the trench with a layer of metal in contact with the semiconductor substrate, a layer of dielectric material overlying the layer of metal, and a second metal overlying the layer of dielectric material;

after filling the trench with the layer of metal, the layer of dielectric material, and the second metal, depositing a layer of oxide overlying the transistors and the second metal in the trench;

etching contact openings through the layer of oxide, one of the contact openings exposing a portion of the second metal and a portion of the silicide contact on the drain region of the selected one of the transistors and a second one of the openings exposing a portion of the silicide contact on the source region of the selected one of the transistors;

filling the contact openings with conductive metal plugs, the metal plug in the one contact opening coupling the second metal to the silicide contact on the drain region and the conductive metal plug in the second opening contacting the silicide contact overlying the source region;

depositing a layer of diffusion barrier material overlying the conductive metal plugs after forming the metal plugs;

forming a bit line contacting the source region of the selected one of the transistors and a word line contacting the gate structure of the selected one of the transistors.

* * * * *